(12) United States Patent
Wilson et al.

(10) Patent No.: US 11,330,708 B2
(45) Date of Patent: May 10, 2022

(54) PATTERNED GLASS LAYERS IN ELECTRONIC DEVICES

(71) Applicant: Apple Inc., Cupertino, CA (US)

(72) Inventors: James R. Wilson, Saratoga, CA (US); Christopher D. Prest, San Francisco, CA (US); Marta M. Giachino, San Francisco, CA (US); Matthew S. Rogers, San Jose, CA (US); Que Anh S. Nguyen, San Jose, CA (US)

(73) Assignee: Apple Inc., Cupertino, CA (US)

( * ) Notice: Subject to any disclaimer, the term of this patent is extended or adjusted under 35 U.S.C. 154(b) by 27 days.

(21) Appl. No.: 16/922,871

(22) Filed: Jul. 7, 2020

(65) Prior Publication Data

US 2020/0344878 A1   Oct. 29, 2020

Related U.S. Application Data

(63) Continuation of application No. 16/680,312, filed on Nov. 11, 2019, now Pat. No. 10,757,805, which is a
(Continued)

(51) Int. Cl.
*H05K 5/00* (2006.01)
*H05K 5/02* (2006.01)
(Continued)

(52) U.S. Cl.
CPC ............ *H05K 1/0306* (2013.01); *C03C 17/22* (2013.01); *C03C 27/10* (2013.01); *G02B 5/285* (2013.01);
(Continued)

(58) Field of Classification Search
CPC combination set(s) only.
See application file for complete search history.

(56) References Cited

U.S. PATENT DOCUMENTS

| 6,985,297 B2 | 1/2006 | Yamanaka et al. |
| 7,824,078 B2 * | 11/2010 | Peng ...................... G09F 13/04 362/351 |

(Continued)

FOREIGN PATENT DOCUMENTS

| CN | 204644191 U | 9/2015 |
| CN | 206306573 U | 7/2017 |

(Continued)

*Primary Examiner* — Lisa Lea-Edmonds
(74) *Attorney, Agent, or Firm* — Treyz Law Group, P.C.; G. Victor Treyz; David K. Cole

(57) ABSTRACT

An electronic device may include electrical components and other components mounted within an interior of a housing. The device may have a display on a front face of the device and may have a glass layer that forms part of the housing on a rear face of the device. The glass layer may be provided with regions having different appearances. The regions may be textured, may have coatings such as thin-film interference filter coatings formed from stacks of dielectric material having alternating indices of refraction, may have metal coating layers, and/or may have ink coating layers. Textured surfaces may be formed on thin glass layers and polymer films that are coupled to the glass layer. A glass layer may be formed from a pair of coupled glass layers. The coupled layers may have one or more recesses or other structures to visually distinguish different regions of the glass layer.

20 Claims, 15 Drawing Sheets

Related U.S. Application Data continuation of application No. 16/375,635, filed on Apr. 4, 2019, now Pat. No. 10,537,023, which is a continuation of application No. 15/841,117, filed on Dec. 13, 2017, now Pat. No. 10,292,286.

(60) Provisional application No. 62/539,454, filed on Jul. 31, 2017.

(51) Int. Cl.
*H05K 5/03* (2006.01)
*H05K 1/03* (2006.01)
*G09F 3/02* (2006.01)
*G02B 5/28* (2006.01)
*C03C 17/22* (2006.01)
*C03C 27/10* (2006.01)
*H04M 1/02* (2006.01)

(52) U.S. Cl.
CPC ............ *G09F 3/02* (2013.01); *H04M 1/0283* (2013.01); *H05K 5/0017* (2013.01); *H05K 5/0243* (2013.01); *H05K 5/03* (2013.01); *G09F 2003/0276* (2013.01); *H04M 1/0266* (2013.01); *H05K 2201/0195* (2013.01)

(56) References Cited

U.S. PATENT DOCUMENTS

| | | | |
|---|---|---|---|
| 8,199,488 B2 | 6/2012 | Zou et al. | |
| 8,568,184 B2 | 10/2013 | Prest et al. | |
| 8,824,140 B2 | 9/2014 | Prest et al. | |
| 8,944,659 B2 | 2/2015 | Dabov et al. | |
| 9,081,230 B2 | 7/2015 | Huang et al. | |
| 9,128,327 B2 | 9/2015 | Yang et al. | |
| 9,201,452 B2 * | 12/2015 | Qi | G06F 1/1637 |
| 9,232,670 B2 | 1/2016 | Pakula et al. | |
| 9,678,258 B2 | 6/2017 | Hankey et al. | |
| 9,743,357 B2 | 8/2017 | Tabe | |
| 9,785,299 B2 | 10/2017 | Wickboldt et al. | |
| 9,808,829 B2 * | 11/2017 | Kole | B05D 1/02 |
| 9,927,650 B1 | 3/2018 | Almanza-Workman et al. | |
| 10,021,798 B2 | 7/2018 | Prest et al. | |
| 10,292,286 B2 | 5/2019 | Wilson et al. | |
| 10,398,043 B2 | 8/2019 | Prest et al. | |
| 10,448,528 B2 * | 10/2019 | Hwang | H05K 7/1427 |
| 10,537,023 B2 | 1/2020 | Wilson et al. | |
| 10,870,261 B2 * | 12/2020 | Zhang | B32B 17/06 |
| 11,123,016 B2 * | 9/2021 | Jo | A61B 5/0537 |
| 2006/0268528 A1 | 11/2006 | Zadesky et al. | |
| 2009/0046240 A1 | 2/2009 | Bolton | |
| 2010/0046162 A1 * | 2/2010 | Chen | G06F 1/1656 |
| | | | 361/679.55 |
| 2011/0012873 A1 | 1/2011 | Prest et al. | |
| 2011/0019354 A1 | 1/2011 | Prest et al. | |
| 2011/0255218 A1 | 10/2011 | Pakula et al. | |
| 2012/0050975 A1 * | 3/2012 | Garelli | H01Q 1/42 |
| | | | 361/679.27 |
| 2013/0071601 A1 | 3/2013 | Bibl et al. | |
| 2013/0083506 A1 | 4/2013 | Wright et al. | |
| 2013/0140965 A1 | 6/2013 | Franklin et al. | |
| 2013/0236699 A1 | 9/2013 | Prest et al. | |
| 2013/0316133 A1 | 11/2013 | Kim | |
| 2013/0320823 A1 | 12/2013 | Kiple et al. | |
| 2014/0139978 A1 | 5/2014 | Kwong | |
| 2014/0168864 A1 | 6/2014 | Lin | |
| 2014/0226269 A1 | 8/2014 | Shedletsky et al. | |
| 2015/0116919 A1 | 4/2015 | Prest et al. | |
| 2015/0121677 A1 | 5/2015 | Prest et al. | |
| 2015/0190986 A1 | 7/2015 | Bibl et al. | |
| 2015/0248142 A1 | 9/2015 | Qian et al. | |
| 2015/0315678 A1 | 11/2015 | Poole et al. | |
| 2016/0170539 A1 | 6/2016 | Watanabe et al. | |
| 2017/0048365 A1 | 2/2017 | Wright et al. | |
| 2017/0146710 A1 | 5/2017 | Jin et al. | |
| 2017/0168637 A1 * | 6/2017 | Hobson | H04M 1/026 |
| 2017/0184762 A1 | 6/2017 | Fujii et al. | |
| 2018/0024594 A1 | 1/2018 | Park et al. | |
| 2019/0037720 A1 | 1/2019 | Wilson et al. | |
| 2019/0235580 A1 | 8/2019 | Park et al. | |
| 2019/0239348 A1 | 8/2019 | Wilson et al. | |
| 2020/0084885 A1 | 3/2020 | Wilson et al. | |
| 2020/0089283 A1 | 3/2020 | Park et al. | |

FOREIGN PATENT DOCUMENTS

| | | |
|---|---|---|
| TW | 201343573 A | 11/2013 |
| TW | 201520650 A | 6/2015 |
| TW | 201525542 A | 7/2015 |
| TW | 201528912 A | 7/2015 |

* cited by examiner

PATTERNED GLASS LAYERS IN ELECTRONIC DEVICES

This application is a continuation of U.S. patent application Ser. No. 16/680,312, filed Nov. 11, 2019, which is continuation of U.S. patent application Ser. No. 16/375,635, filed Apr. 4, 2019, now U.S. Pat. No. 10,537,023, which is a continuation of U.S. patent application Ser. No. 15/841,117, filed Dec. 13, 2017, now U.S. Pat. No. 10,292,286, which claims the benefit of provisional patent application No. 62/539,454, filed Jul. 31, 2017, each of which is hereby incorporated by reference herein in its entirety.

BACKGROUND

This relates generally to electronic devices, and, more particularly, to forming visually distinguishable regions in glass structures in electronic devices.

Electronic devices such as cellular telephones, computers, watches, and other devices may contain glass structures. For example, electronic devices may have displays in which an array of pixels is covered with a transparent layer of glass. In some devices, a rear housing wall may be covered with a layer of glass. A decorative layer may be applied to the layer of glass to help improve the appearance of the rear housing wall.

SUMMARY

An electronic device may include electrical components and other components mounted within an interior of a housing. The device may have a display on a front face of the device and may have a glass layer that forms a rear housing wall on an opposing rear face of the device.

The rear housing wall may be provided with regions having different appearances. The regions may be selectively textured, may be selectively provided with coatings such as thin-film interference filter coatings formed from stacks of dielectric material having alternating indices of refraction, metal coating layers, and/or ink coating layers, and/or may be provided with other structures that visually distinguish regions from each other.

A region of the rear housing wall may have a matte appearance formed from a textured surface. Textured surfaces may be formed directly on the glass layer and/or textured surfaces may be formed on thin glass layers and polymer films that are coupled to the glass layer.

A glass layer may be formed form a pair of coupled glass layers. The coupled layers may have one or more recesses or other structures to visually distinguish different regions of the glass layer.

DETAILED DESCRIPTION

Electronic devices and other items may be provided with structures that are formed from transparent materials. For example, an electronic device may include a display. The display may have an array of pixels for displaying images for a user. To protect the pixel array from damage, the display may be covered with a layer of transparent material that serves as a display cover layer. The transparent material may be ceramic, polymer, crystalline material such as sapphire, or other suitable transparent material. Configurations in which such layers are formed from glass are sometimes described herein as an example. Portions of electronic devices such as optical windows, buttons, housing walls (e.g., rear housing walls), and other structures other than display cover layers may also be formed from ceramic, polymer, crystalline material such as sapphire, and/or glass and may be clear or may be colored. For example, the rear face of an electronic device may be covered with a layer of glass that forms a rear housing wall.

It may be desirable to locally and/or globally modify the appearance of a layer of glass (or other layer of material) in an electronic device. For example, it may be desirable to create attractive trim around a display, around the periphery of a camera window or button, or other suitable location. In some arrangements it may be desirable to selectively modify the appearance of a glass layer or other structure to form text, graphical patterns such as icons, logos, and/or other patterns visible to a user.

When creating structures such as these, there is a potential for unattractive features to develop on the glass layer. For example, if care is not taken, undesired shadowing may occur or surfaces may appear to sparkle excessively.

These concerns can be addressed by forming visually distinguishable areas on the glass layer (e.g., visually distinguishable regions for forming logos, text, etc.) using textured areas, neutrally colored or non-neutrally colored reflective coatings formed from a stack of alternating high and low index-of-refraction dielectric layers or other thin-film interference filter coatings (sometimes called dichroic layers or decoration layers), ink layers, adhesive layers, and/or other structures that selectively and/or globally impart visible changes to glass layers and other layers in an electronic device.

Figure 1:
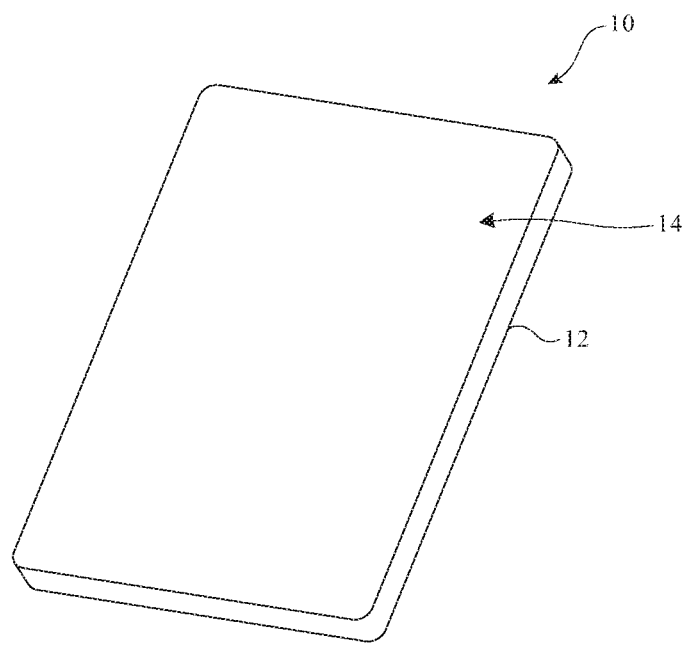
FIG. 1 is a perspective view of an illustrative electronic device in accordance with an embodiment.

An illustrative electronic device of the type that may include glass structures is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device (e.g., a watch with a wrist strap), a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, titanium, gold, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies.

Display 14 may include one or more layers of glass. For example, the outermost layer of display 14, which may sometimes be referred to as a display cover layer, may be formed from a hard transparent material such as glass to help protect display 14 from damage. Other portions of device 10 such as portions of housing 12 and/or other structures may also be formed from glass. For example, walls in housing 12 such as a rear housing wall may be formed from glass.

Figure 2:
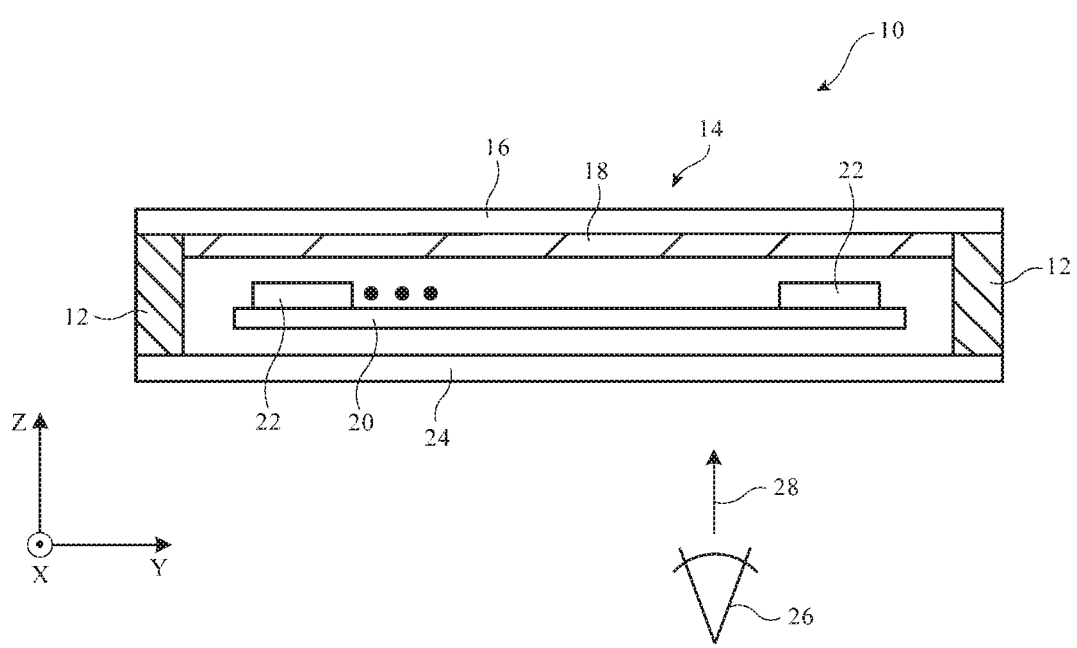
FIG. 2 is a cross-sectional side view of an illustrative electronic device in accordance with an embodiment.

FIG. 2 is a cross-sectional side view of an illustrative device that contains glass structures such as device 10 of FIG. 1. As shown in FIG. 2, device 10 may have opposing front and rear faces. Display 14 may be formed on the front face of device 10. Housing 12 may have a rear housing wall formed from layer 24 on the opposing rear face of device 10. Portions of housing 12 may also form sidewalls for device 10. These sidewall portions of housing 12 may be formed from a material such metal (as an example).

Display 14 may include display cover layer 16 (e.g., a layer of glass) and display module 18 (e.g., display layers that form an array of pixels that present images for a user on the front face of device 10). Display module 18 may be a liquid crystal display structure, an organic light-emitting diode display structure, or other suitable display. During operation, module 18 may present images that are viewable through display cover layer 16. The rear of the housing for device 10 may be formed from a glass structure (e.g., layer 24 may be a glass layer). The thickness of layer 24 may be 0.2-5 mm, at least 0.05 mm, at least 0.1 mm, at least 0.2 mm, at least 0.5 mm, at least 0.75 mm, less than 1 mm, less than 2 mm, or other suitable thickness. If desired, a metal plate or other strengthening structures may be laminated to the inner surface of layer 24 to enhance strength. Internal components in device 10 such as components 22 (e.g., electrical components such as integrated circuits, sensors, etc.) may be mounted on one or more substrates such as printed circuit 20.

Inactive border areas in layer 16 and portions of other glass structures in device 10 such as some or all of glass layer 24 may be covered with coatings and other structures. In some arrangements, a coating may be used primarily to block light (e.g., to hide internal device structures from view). For example, a coating may be formed on the inner surface of layer 24 to hide internal components from view from a user such as viewer 26 who is viewing device 10 in direction 28. In other arrangements, a patterned coating may be used to form text, logos, trim, and/or other visible patterns. Coatings that are unpatterned and that coat all of glass layer 24 may also be used to block internal structures from view and/or to provide device 10 with a desired appearance. Patterned coatings may create visible elements and may also block internal structures from view.

Coatings for glass structures in device 10 may be black or other neutral colors or may have non-black (non-neutral) colors (e.g., blue, red, yellow, gold, rose gold, red-violet, pink, etc.). In some configurations, some or all of the coatings for glass structures in device 10 may be shiny (e.g., exhibiting a mirror-like reflective surface with a reflectance of at least 50%, at less 80%, at least 95%, less than 99.99%, or other suitable reflectance). Textured features may also be formed.

If desired, a coating may include one or more layers that define textured regions on a layer such as glass layer 24 that are interspersed with smooth and shiny regions that are not textured. As an example, a logo may be formed form a shiny region and may be surrounded by a matte textured region. Textured and shiny regions may be formed from textured and/or reflective surfaces on glass layer 24 and/or on one or more layers coupled to glass layer 24. For example, textured and/or shiny regions may be formed from textured and/or shiny films that are adhered to glass layer 24. Textured and shiny regions may also be defined by texturing selected portions of glass layer 24 directly.

Coatings on glass layer 24 and/or other glass structures in device 10 may be formed from metals, semiconductors, and/or dielectrics. Dielectric materials for the coatings may include organic materials such as polymer layers and/or inorganic materials such as oxide layers, nitride layers, and/or other inorganic dielectric materials. In arrangements in which a shiny surface is desired, a metal coating with a high reflectivity or a thin-film interference filter with dielectric layers (e.g., a stack of dielectric layers of alternating higher and lower refractive index values) may be configured to serve as a mirror coating (reflective coating). Ink coatings may also be incorporated onto the glass structures.

Figure 3:
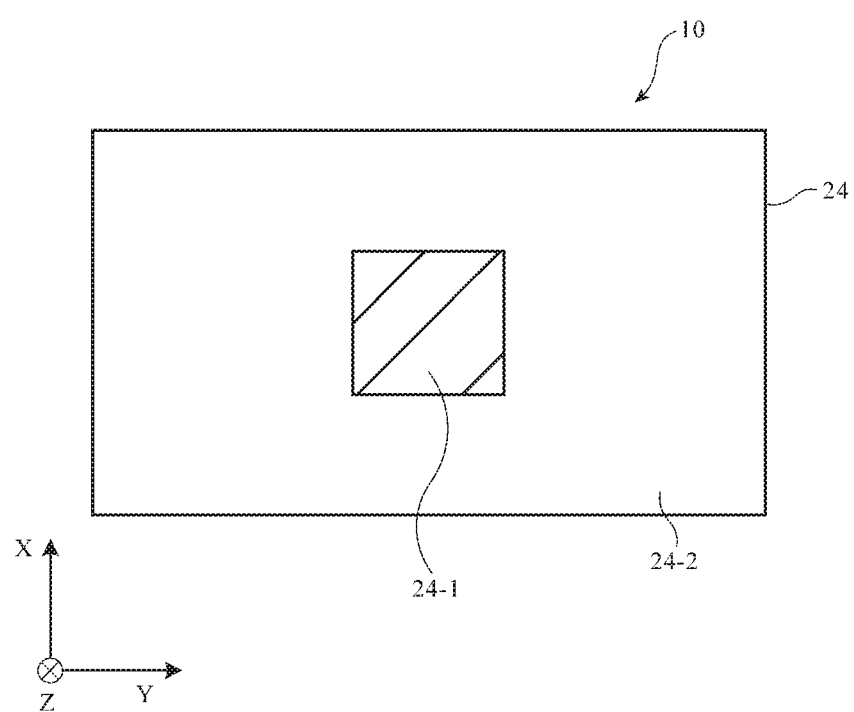
FIG. 3 is a rear view of an illustrative electronic device in accordance with an embodiment.

FIG. 3 is a top view of an illustrative configuration for the rear face of device 10 in which one region (region 24-1) has a first appearance (textured, shiny, a particular color, etc.) and has a first shape (e.g., text, a logo, a trim pattern, or other patterned shape) and in which another region (background region 24-2 in this example) has a second appearance (e.g., textured, shiny, a particular color, etc.). In order to ensure that region 24-1 is visible to a user of device 10, the appearances of regions 24-1 and 24-2 may contrast with each other. For example, in a scenario in which region 24-1 is reflective (e.g., in which region 24-1 is a shiny silver or gold region associated with a logo, text, etc.), region 24-2 may have a matte finish.

Glass layer 24 may have any suitable number of separately patterned regions such as regions 24-1 and 24-2, each of which may potentially have a different separate appearance. Configurations in which glass layer 24 has one or more patterned layers that provide textured and shiny regions may sometimes be described herein as an example. The regions of device 10 that have different appearances may be formed by selectively patterning glass layer 24 and associated coatings, films, and other structures. For example, these regions may be selectively formed by depositing coatings using physical vapor deposition, chemical vapor deposition, or other deposition techniques followed by photolithography and etching, using shadow-masking or other selective deposition techniques such as printing techniques, by using selective surface treatment such as selective laser treatment, selective roughening or polishing using mechanical or chemical-mechanical polishing equipment, selective treatment with machining equipment, sand-blasting equipment or blasting equipment using other particles, by roughening or otherwise processing the surfaces of polymer films using embossing tools, presses, and/or by using other equipment for selectively processing particular areas of coatings, films, and/or surfaces (e.g., glass layer surfaces).

Textured surfaces in layer 24 and/or in coatings, films, and/or other layers coupled to layer 24 may provide a matte finish. These textured surfaces may have protruding surface structures that are 100 s of nm to 1 micron in height (e.g., at least 100 nm, at least 500 nm, less than 5 microns, less than 1 micron). Such textured surfaces may have an RMS surface roughness of 100 nm to 2 microns or other suitable value that provides a desired appearance (e.g., a matte appearance). Smooth surfaces (e.g., polished surfaces or other smooth surfaces) may have protruding surface features that are less than 5 nm in height, surfaces with features that are less than 50 nm in height, etc.). Such smooth surfaces may have an RMS surface roughness of less the RMS surface roughness of the textured surfaces (e.g., an RMS surface roughness of less than 25 nm or other suitable value that provides a desired appearance such as a smooth potentially reflective appearance). If desired, regions of the rear housing wall of device 10 or other glass-layer structures may have other roughness values (e.g., values intermediate to those associated with strongly textured matte finishes and smooth reflective finishes). The use of textured and smooth surfaces to form visually distinct regions of glass layer 24 is merely illustrative.

FIGS. 4-16 set forth various examples of patterned regions on a structure in device 10 such as a rear housing wall (e.g., glass layer 24) that have potentially different visual appearances. These regions may be used in forming logos, text, trim, and/or other patterns. There may be any suitable number of patterned regions on layer 24 and these layers may include textured backgrounds and smooth backgrounds, textured foregrounds and smooth backgrounds, background and foreground elements of different colors, reflectivity values, etc. Coatings may be provided on the outer surface of these illustrative patterned regions (e.g., antismudge coatings, antiscratch coatings, etc.) or, if desired, these external coating layers may be omitted and/or incorporated into the coatings, films, and surfaces forming layer 24. The examples of FIGS. 4-16 are merely illustrative.

Figure 4:
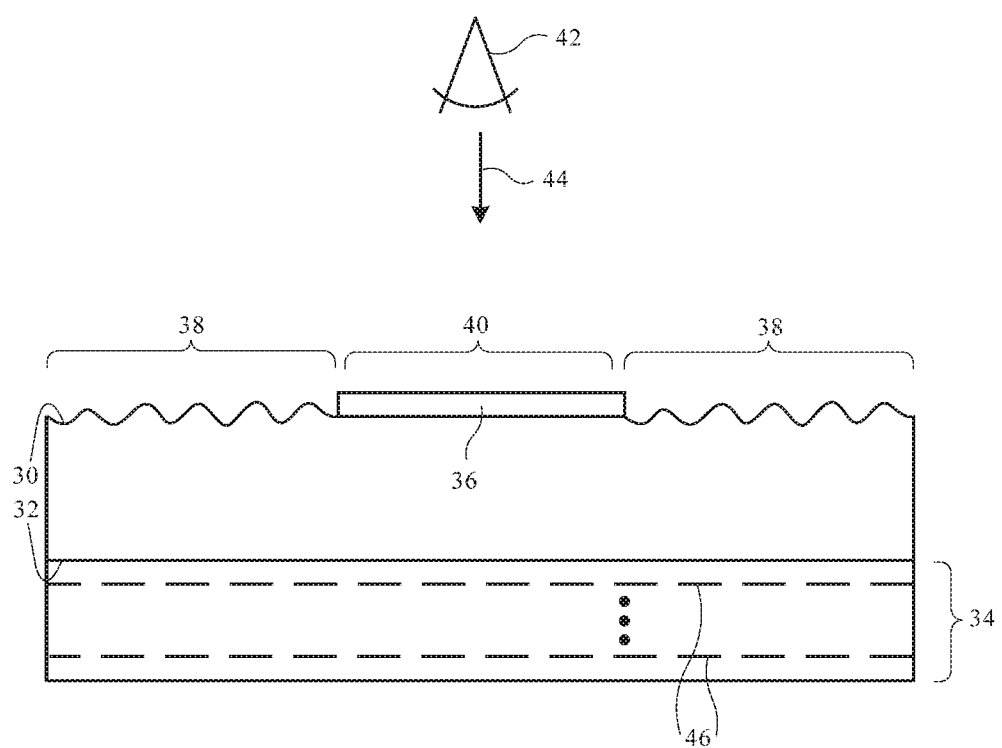
FIG. 4 is a cross-sectional side view of an illustrative glass layer with a textured region and a smooth region overlapped by a coating on an outer surface of the glass layer in accordance with an embodiment.

FIG. 4 is a cross-sectional side view of glass layer 24 in an illustrative configuration in which the outer surface of layer 24 has a textured region and a coated region such as a smooth shiny region. The textured region is visually distinguishable from the smooth region because the surface roughness of the textured region is larger than that of the smooth region and therefore may provide the textured region with a matte appearance. Glass layer 24 may have opposing inner and outer surfaces such as inner surface 32 and outer surface 30. Inner surface 32 may face internal device components such as components 22 of FIG. 1 in the interior of housing 12 and device 10. Outer surface 30 may face a user of device 10 such as viewer 42 who is viewing device 10 in direction 44 from the exterior of device 10.

In the example of FIG. 4, inner surface 32 is smooth and is coated by inner coating layer 34. Coating layer 34 may be a global layer that covers all of the inner surface of layer 24 (as an example). Outer coating layer 36 may be formed on region 40 of outer surface 30. Region 38 of outer surface 30 may be textured and may, if desired, surround region 40. Coatings 36 and 34 may include one or more sublayers (see, e.g., illustrative sublayers 46 of coating 34) or may each be formed of only a single layer of material.

Coatings 36 and 34 may be shiny. For example, a stack of multiple dielectric sublayers in coating 36 and/or 34 may have alternating index of refraction values to form a thin-film interference filter or coating 36 and/or coating 34 may include a reflective material such as metal. The texture of outer surface 30 in region 38 may provide glass layer 24 with a pleasing feeling to the touch. Coating 36 in region 40, which may be a physical vapor deposition coating deposited through a shadow mask or other patterned layer, may be shaped to form text, a logo, or other visual element and may have a different appearance than textured outer surface 30 in region 38. Coating 34 may help hide internal components from view by blocking light transmission into the interior of device 10. If desired, coating 34 may be formed from an opaque material such as neutrally colored (white, black, or gray) or non-neutrally colored (red, blue, yellow, etc.) ink.

Figure 5:
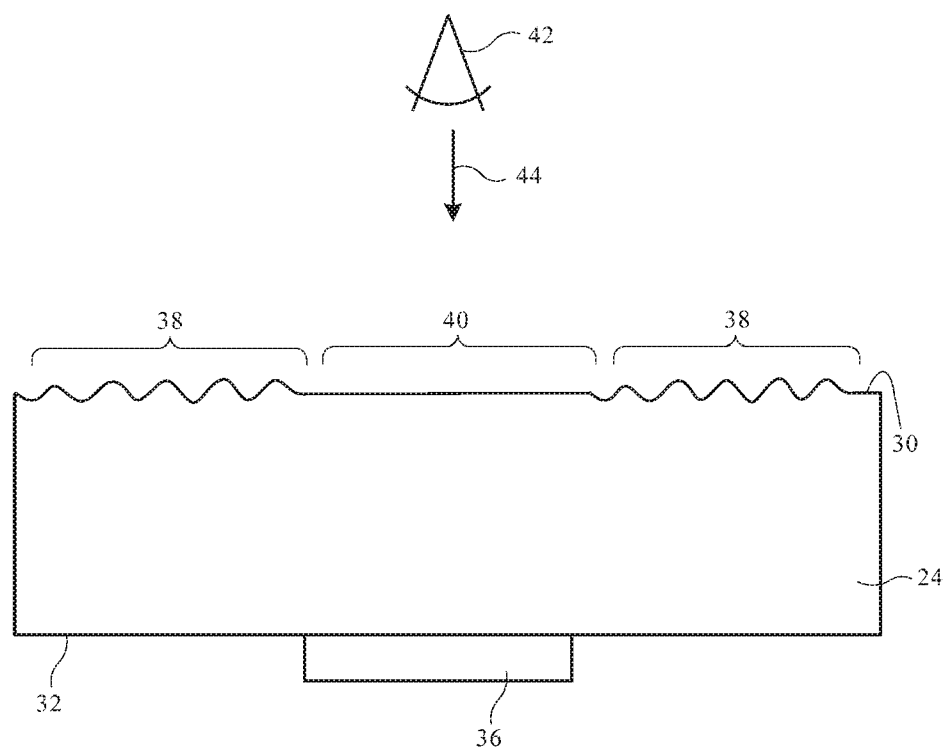
FIG. 5 is a cross-sectional side view of an illustrative glass layer with an outer surface having a textured region and a smooth region and having an inner surface with a coating that overlaps the smooth region in accordance with an embodiment.

In the illustrative configuration of FIG. 5, coating 36 in region 40 has been formed on inner surface 32 of glass layer 24. Outer surface 30 is smooth in region 40 and textured in region 38. This approach protects coating 36 under glass layer 24.

Figure 6:
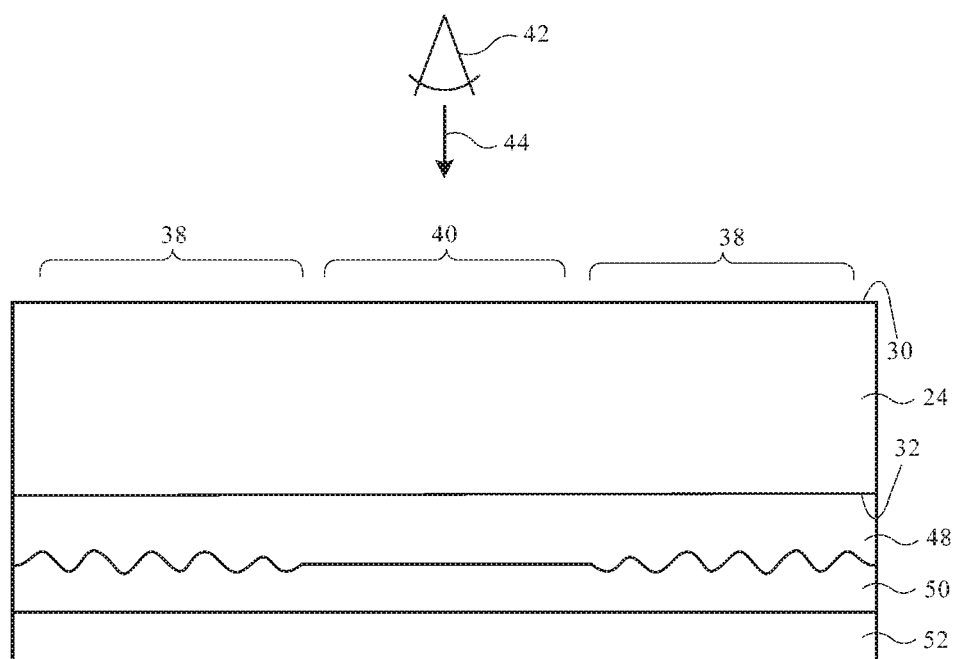
FIG. 6 is a cross-sectional side view of an illustrative glass layer with an inner film with textured regions in accordance with an embodiment.

FIG. 6 is a cross-sectional side view of an illustrative glass layer to which a layer of film with textured regions has been attached. As shown in FIG. 6, film 48 (e.g., a flexible polymer sheet) may have a smooth surface that is attached to inner surface 32 of glass layer 24. Film 48 may be attached directly to surface 32 or may be attached to surface 32 with an intervening layer of adhesive. Film 48 may have an inner surface that is textured in region 38 and that is smooth in region 40, so that regions 38 and 40 have respective matte and shiny appearances. Film 48 may be covered with polymer layer 50. Polymer layer 50 may have a lower index of refraction than film 48 and may be covered with coating 52. Coating 52 may be formed from ink or a shiny material such as metal. If desired, coating 52 may be a shiny coating formed from a thin-film interference filter with high reflectively.

Figure 7:
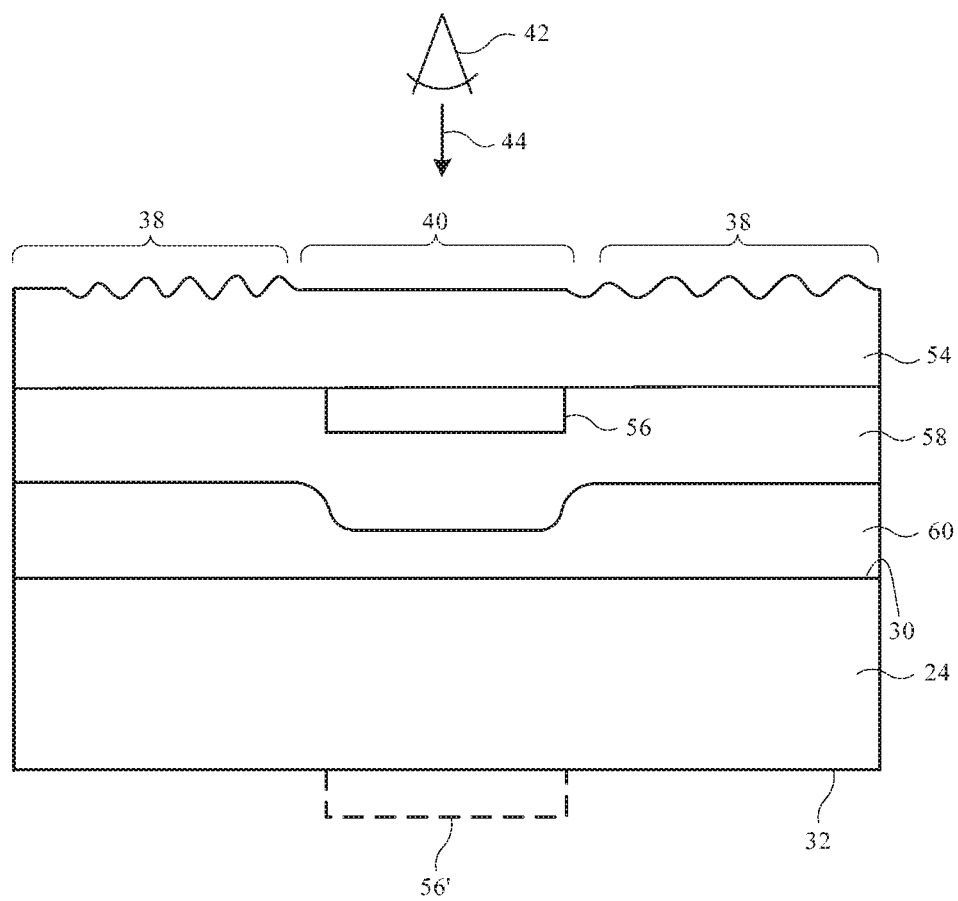
FIG. 7 is a cross-sectional side view of an illustrative glass layer covered with a textured thin glass layer and multiple coatings interposed between the thin glass layer and an outer surface of the glass layer in accordance with an embodiment.

In the example of FIG. 7, layer 54 may be a polymer film or may be a thin glass layer that is thinner than glass layer 24 (e.g., at least 3 times thinner, at least 7 times thinner, at least 10 times thinner, at least 20 times thinner, etc.). The use of glass as an outer layer on top of glass layer 24 may help reduce scratches. In configurations in which glass is used, the thickness of layer 54 may be relatively thin to enhance the appearance of the logo or other pattern formed by region 40. Layer 54 may, if desired, be a thin glass layer with at thickness of 20-250 microns, at least 30 microns, at least 100 microns, at least 150 microns, less than 200 microns, less than 500 microns, or less than 800 microns. Thin glass layer 54 may have an outer surface that is textured in region 38 to provide region 38 with a matte appearance that is smooth in region 40 or textured region 38 may be formed from a textured surface on the inner surface of layer 54.

As shown in FIG. 7, the inner surface of layer 54 may be selectively coated with first coating layer 56 in region 40 (e.g., a patterned coating layer). A second coating layer such as blanket coating layer 58 may be used to cover coating layer 56. Coatings 56 and 58 may provide an attractive appearance (e.g., a shiny appearance with a desired color, reflectivity, etc.). Coatings 56 and 58 may be formed from dielectric thin-film interference filters (e.g., stacks of alternating high and low index-of-refraction materials), may be formed from metal, and/or may be formed from other materials (e.g., ink). Because coating layer 56 is present only in region 40 and not in region 38, the presence of coating layer 56 will help to visually distinguish regions 38 and 40. If desired coating 56 may be omitted and/or coating 58 may be omitted or coating 58 may be selectively omitted from region 40 and not region 38. Optically clear adhesive 60 may be used in attaching film 54 and coatings 56 and 58 to outer surface 30 of layer 24. If desired, coating 56 (e.g., a thin-film interference filter, metal coating layer, and/or ink layer) may be formed on inner surface 32 of glass layer 24 instead of on the inner surface of film 54, as illustrated by coating 56'. In other configurations, both coatings 56 and 56' may be used.

Figure 8:
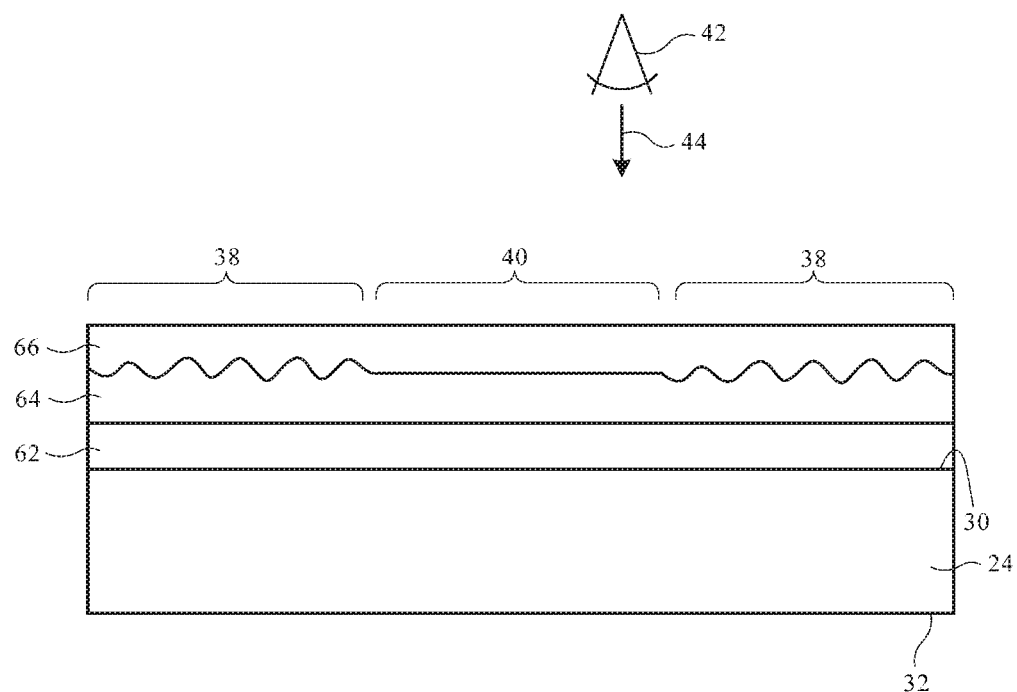
FIG. 8 is a cross-sectional side view of an illustrative glass layer with an outer surface covered with a layer such as a thin glass layer and an interposed coating in accordance with an embodiment.

FIG. 8 is a cross-sectional side view of glass layer 24 in an illustrative configuration in which a thin glass layer with a textured inner surface has been coupled to outer surface 30. As shown in FIG. 8, thin glass layer 66 (e.g., a glass layer with at thickness of at least 30 microns, at least 100 microns, at least 150 microns, less than 200 microns, less than 500 microns, or less than 800 microns that is at least 3 times thinner, 7 times thinner, 10 times thinner, 20 times thinner, etc. than layer 24) may have a textured inner surface in region 38 to provide region 38 with a matte appearance. The inner surface of thin glass layer 66 may be smooth in region 40. Coating layer 64 (e.g., a dielectric thin-film interference coating, a metal thin-film coating, or other material such as ink) may be formed on the inner surface of layer 66. If desired, other patterned coatings such as coating 64 may be provided, as described in connection with the multiple coatings on layer 54 of FIG. 7 (e.g., only in region 38, only in region 40, or overlapping both regions 38 and 40). Optically clear adhesive 62 may be used to attach layer 66 and coating layer 64 to outer surface 30 of layer 24.

If desired, chemical strengthening may be used to strengthen thin-glass layers such as layer 54 of FIG. 7 or layer 66 of FIG. 8. In other configurations, thin-glass layers such as layer 54 and layer 66 may be replaced by a layer of polymer with textured regions and smooth regions.

Figure 9:
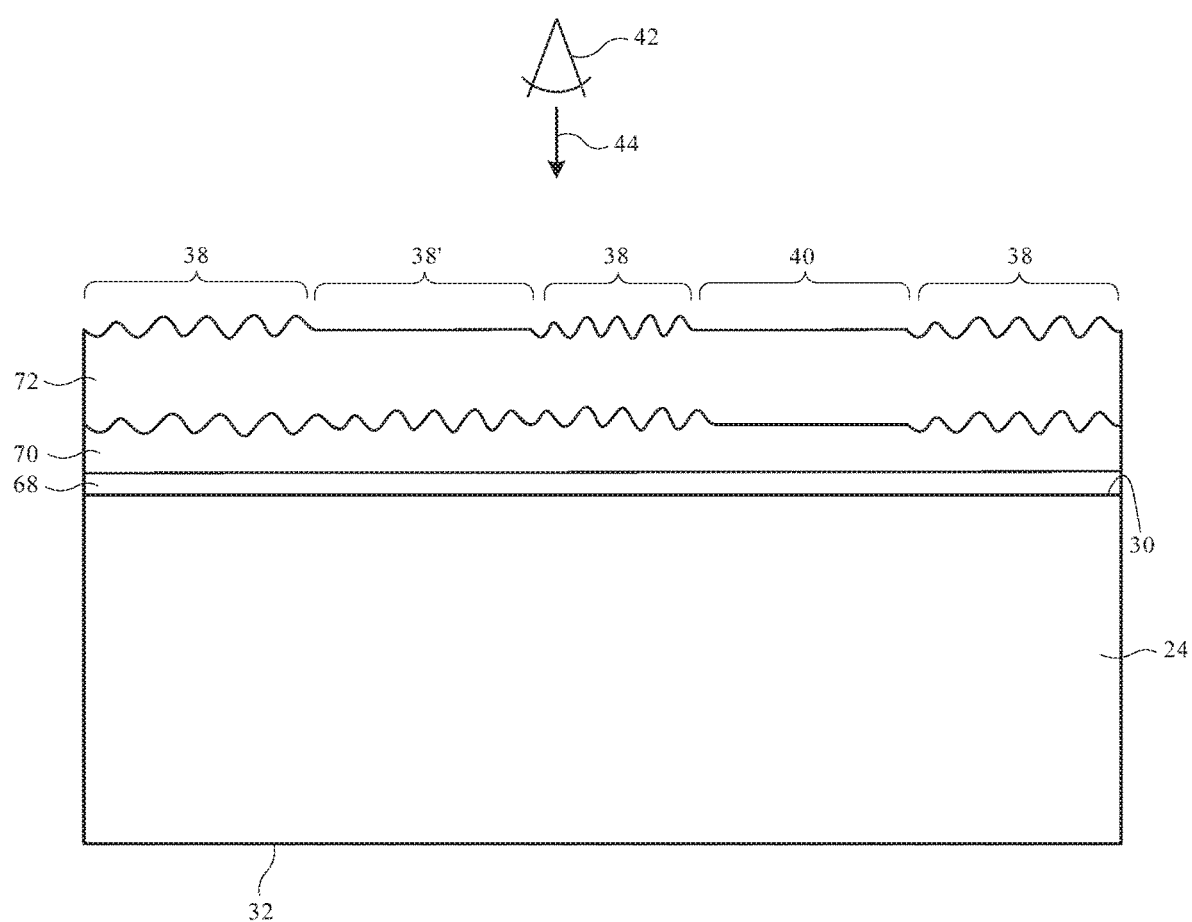
FIG. 9 is a cross-sectional side view of an illustrative glass layer coated with multiple selectively textured layers in accordance with an embodiment.

In the example of FIG. 9, layer 72 has an outer surface with texture in region 38. The inner surface of layer 72 may be textured in region 38 and region 38'. As a result, textured region 38 will have an appearance that is more matte than the appearance of textured region 38'. Layer 72 may be formed from a thin glass layer (see, e.g., layer 54 of FIG. 7 and layer 66 of FIG. 8) or a sheet of polymer. Coating layer 70 may be formed on the inner surface of layer 72 and optically clear adhesive layer 68 may be used in attaching layer 72 and coating 70 on layer 72 to outer surface 30. Coating layer 70 may be a thin-film interference filter, metal layer, or ink layer. There is no texture on layer 72 or coating 70 in region 40, so region 40 will not have a matte appearance. Because region 38 and region 38' have different appearances, regions 38 and/or 38' may be provided with the shapes of text, logos, trim patterns, and/or other patterns and may be visually distinguished by viewer 42.

Figure 10:
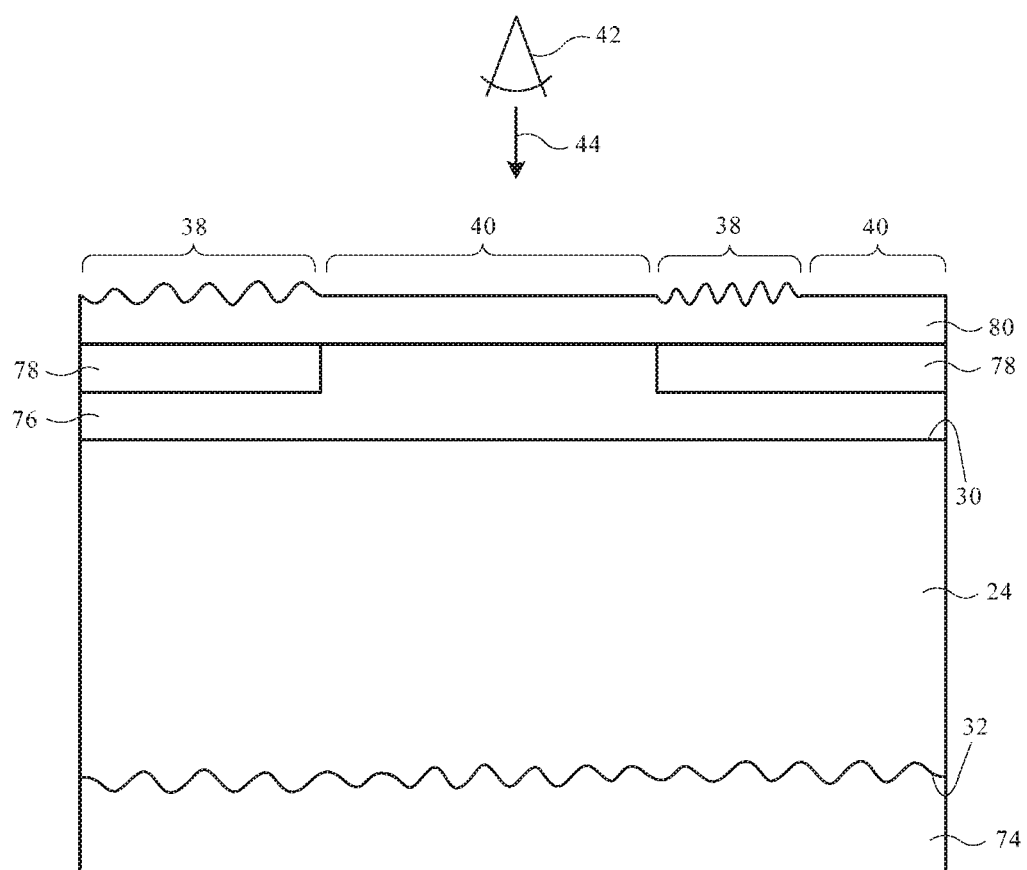
FIG. 10 is a cross-sectional side view of an illustrative glass layer with a textured coated film attached to the glass layer with an interposed layer of adhesive in accordance with an embodiment.

Another illustrative arrangement is shown in FIG. 10. As shown in FIG. 10, inner surface 32 of glass layer 24 may be textured to provide an overall matte appearance to layer 24. Coating layer 74 (e.g., a thin-film interference filter coating, metal coating, and/or ink coating) may be used to help block internal components from view by user 42. Layer 80 (e.g., a polymer film or a thin glass layer) may have an outer surface that is textured in region 38 to enhance the matte appearance of glass layer 24 in region 38. In region 40, the outer surface of layer 80 may be smooth. Coating layer 78 may be selectively formed in region 38 on the inner surface of layer 80 to adjust color, reflectivity, and/or other optical characteristics in region 38 relative to region 40. Optically clear adhesive 76 may be used in attaching layer 80 to outer surface 30 of layer 24.

Figure 11:
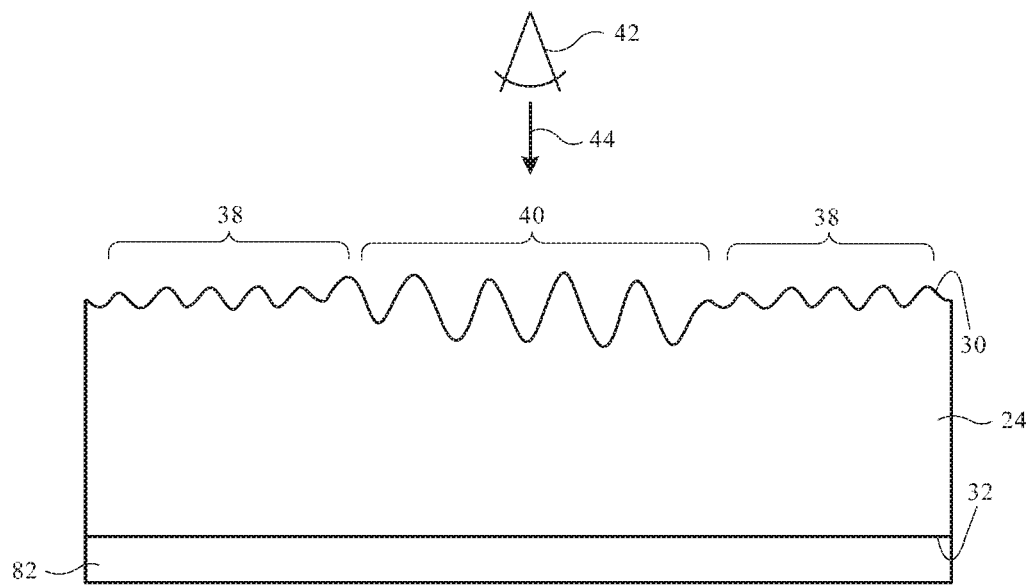
FIG. 11 is a cross-sectional side view of an illustrative glass layer with textured regions formed directly on an outer surface of the glass in accordance with an embodiment.
Figure 12:
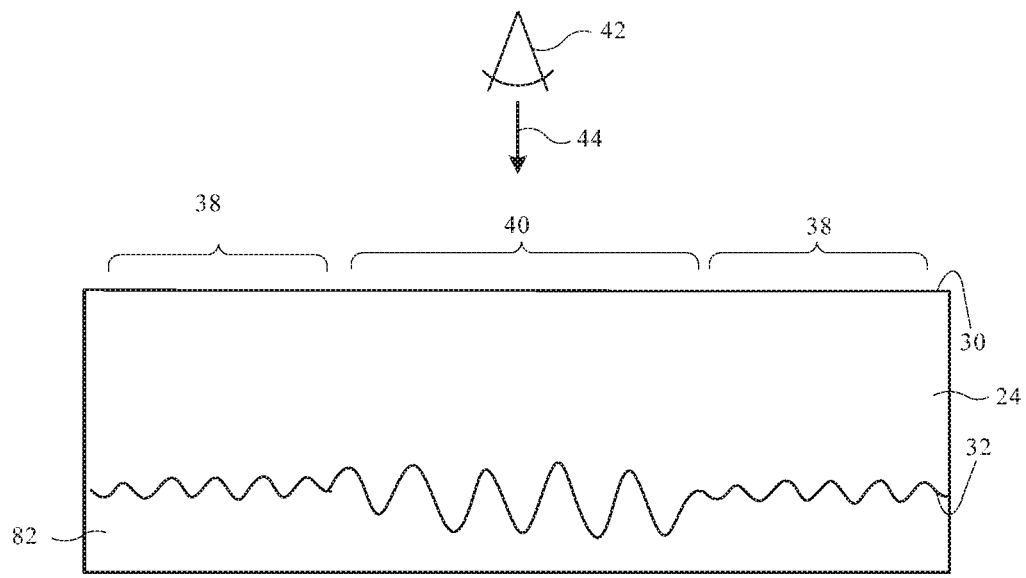
FIG. 12 is a cross-sectional side view of an illustrative glass layer with textured regions formed directly on an inner surface of the glass in accordance with an embodiment.

In the illustrative configuration of FIGS. 11 and 12, a first texture is formed in region 38 and a second texture (e.g., a texture for a logo, text, or other pattern) or no texture is formed in region 40. Coating layer 82 (e.g., a thin-film interference filter coating, metal coating, and/or ink coating) may be formed on inner surface 32. In the example of FIG. 11, outer surface 30 of glass layer 24 is textured (e.g., with a first texture in region 38 and a different second texture or no texture in region 40). In the example of FIG. 12, inner surface 32 of glass layer 24 is selectively textured in this way.

Figure 13:
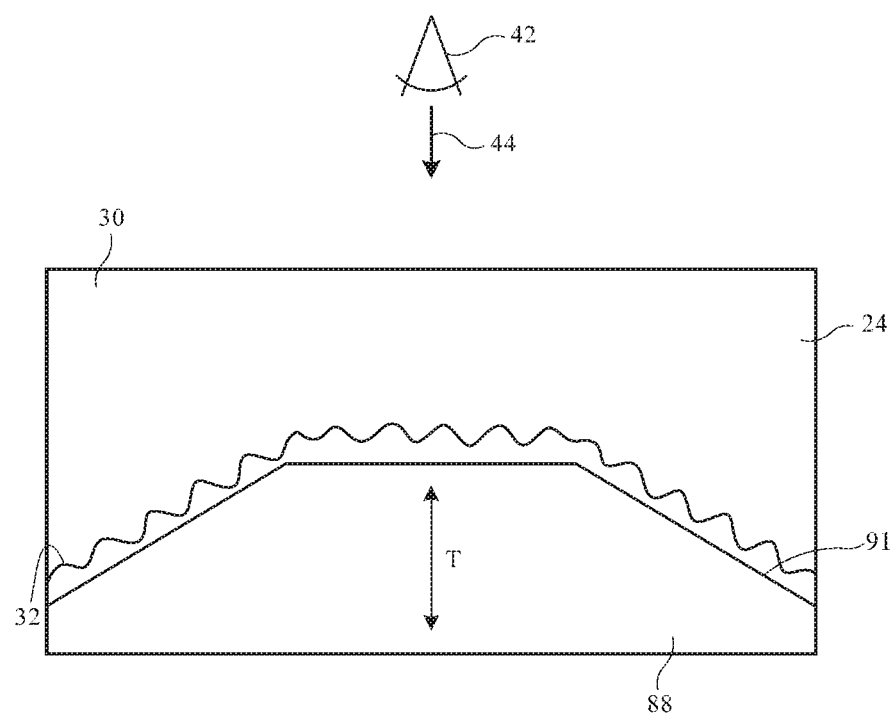
FIG. 13 is a cross-sectional side view of an illustrative glass layer having a textured surface and having a recess with a tapered cross-sectional profile in accordance with an embodiment.

FIG. 13 shows how inner surface 32 of glass layer 24 may have a recess (e.g., a recess with sloped sidewalls, vertical sidewalls, or other sidewall profile). Protruding layer 88 (e.g., a glass or polymer layer with a thickness T of about 50-150 microns, at least 75 microns, fewer than 500 microns, etc.) may have a protrusion that is placed in the recess in inner surface 32 and that has a shape that mates with this recess. An optional layer such as layer 91 (e.g., a thin-film interference filter coating, metal coating, and/or ink coating and/or a layer of adhesive) may be interposed between layer 88 and layer 24.

Figure 14:
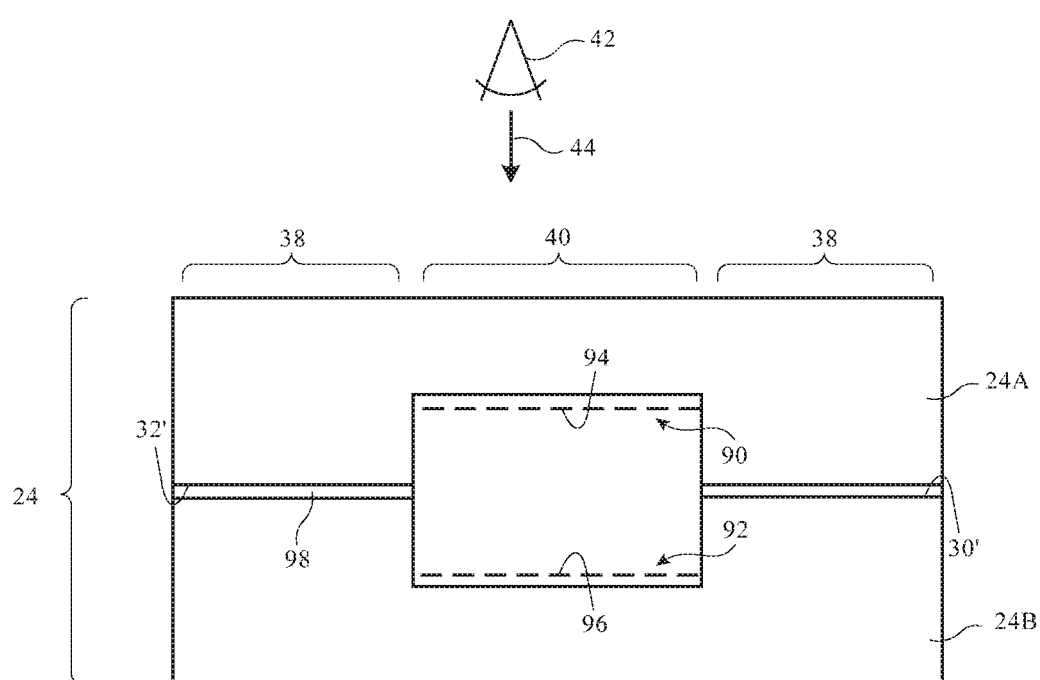
FIG. 14 is a cross-sectional side view of an illustrative glass layer formed from a pair of coupled sublayers having overlapping recesses that define a cavity within the glass layer in accordance with an embodiment.
Figure 15:
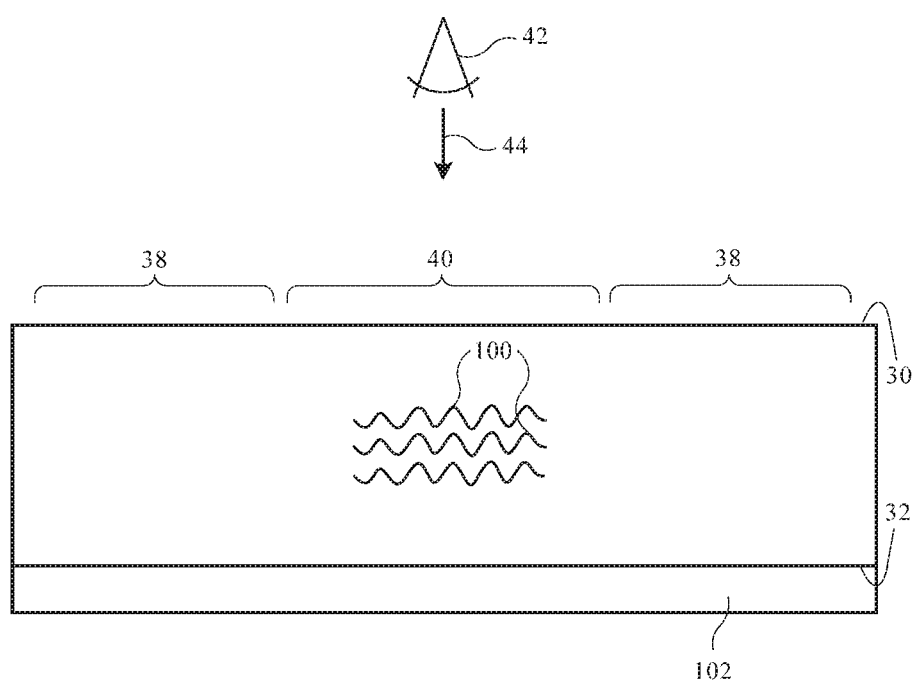
FIG. 15 is a cross-sectional side view of an illustrative glass layer with visible internal structures such as laser-damaged regions embedded within the glass layer in accordance with an embodiment.

In the example of FIG. 14, glass layer 24 has been formed from mating first and second layers such as outer layer 24A and inner layer 24B. Inner surface 32' of outer layer 24A and/or outer surface 30' of inner layer 24B may be provided with recesses, protrusions, and/or other non-planar portions to create visual contrast between regions 38 and 40. For example, inner surface 32' may have recess 90 and outer surface 30' may have a fully or partly overlapping recess such as recess 92 (e.g., a mating recess). The inner surfaces of recesses 90 and 92 may, if desired, be provided with respective coating layers 94 and 96 (e.g., thin-film interference filter coatings, metal coatings, and/or ink coatings). Recesses 90 and 92 may be filled with air, a liquid, a polymer, a glass insert or an insert formed from other material, and/or other material. Outer layer 24A and inner layer 24B may be coupled using adhesive 98. In some configurations, recess 90 or recess 92 may be omitted. Glass layer 24 may also be formed only from layer 24A and not layer 24B, if desired.

If desired, laser processing techniques may be used to form visible structures on glass layer 24. For example, high power laser beams may be focused into interior portions of glass layer 24. This may create laser-damaged regions that are embedded within layer 24, as shown by laser-damaged portions 100 of FIG. 15. Laser processing to form these visible laser-processed structures may take place in region 40 but not region (or vice versa) to provide regions 38 and 40 of glass layer 24 with a visually distinguishable appearance. Optional coating layer 102 (e.g., a thin-film interference filter coating, metal coating, and/or ink coating) may be formed on inner surface 32 of layer 24.

Figure 16:
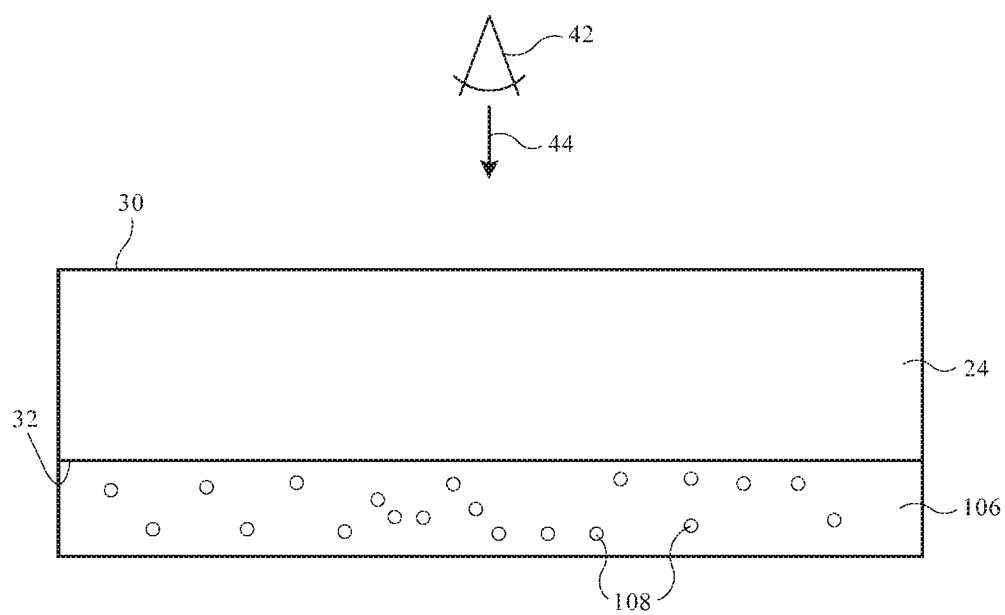
FIG. 16 is a cross-sectional side view of an illustrative glass layer with a coating having particles such as glass particles in accordance with an embodiment.

As shown in FIG. 16, inner surface 32 of glass layer 24 may be coated with a polymer layer such as layer 106. Layer 106 may contain particles such as particles 108. Particles 108 may have a different refractive index than the polymer binder that makes up layer 106 and may have a diameter that is sufficient to give rise to light ray reflection. Particles 108 may, for example, be glass particles having diameters of 20-100 microns, at least 10 microns, at least 30 microns, fewer than 200 microns, etc. and may provide glass layer 24 with a pearlescent appearance.

If desired, one or more of the polymer layers of FIGS. 4-16 coupled to glass layer 24 may be formed from glass rather than polymer and/or one or more of the glass layers coupled to glass layer 24 may optionally be formed from a polymer coating or polymer film. Glass layer 24 may be replaced with a polymer layer or a layer of other material (sapphire or other crystalline material, ceramic, etc.). The illustrative structures of FIGS. 4-16 may be formed on a glass layer 24 that forms part of a rear housing wall, a window structure for an optical component, a display cover layer, a button member, a keyboard key, a trackpad surface, or any other suitable structure in device 10. The examples of FIGS. 4-16 are merely illustrative and the coatings, glass layers, films, textures, and other structures of these examples may be used together, if desired (e.g., by stacking the layers of one configuration on top of those of another, in laterally spacing the structures from different configurations across a common glass layer, etc.).

The foregoing is merely illustrative and various modifications can be made to the described embodiments. The foregoing embodiments may be implemented individually or in any combination.

What is claimed is:

1. An electronic device having opposing front and rear faces and an interior, the electronic device comprising:
   a display that emits light through the front face; and
   a glass layer that forms a housing wall on the rear face, wherein the glass layer is a continuous glass layer, wherein the continuous glass layer has a first glass region having a first appearance and a second glass region having a second appearance that is different from the first appearance, and wherein the second glass region surrounds the first glass region.

2. The electronic device defined in claim 1 further comprising:
   a coating that forms a logo on the glass layer, wherein the logo is overlapped by the first glass region.

3. The electronic device defined in claim 2 wherein the first appearance is a shiny appearance and the second appearance is a matte appearance.

4. The electronic device defined in claim 2 wherein the first glass region has a first color and the second glass region has a second color that is different from the first color.

5. The electronic device defined in claim 4 wherein the first color is selected from the group of colors consisting of: silver and gold.

6. The electronic device defined in claim 2 wherein the first glass region is a smooth region and wherein the second glass region is a textured region.

7. The electronic device defined in claim 6 wherein the glass layer has an inner surface facing the interior and an opposing outer surface, and wherein the textured region is formed on the outer surface of the glass layer.

8. The electronic device defined in claim 6 wherein the glass layer has an inner surface facing the interior and an opposing outer surface, and wherein the textured region is formed on the inner surface of the glass layer.

9. The electronic device defined in claim 1 further comprising:
   a thin-film interference filter coating comprising a stack of dielectric layers on the glass layer.

10. The electronic device defined in claim 9 wherein the thin-film interference filter coating overlaps the first glass region and the second glass region of the glass layer.

11. The electronic device defined in claim 9 wherein the thin-film interference filter coating overlaps the first glass region of the glass layer and does not overlap the second glass region of the glass layer.

12. The electronic device defined in claim 1 wherein the glass layer is a first glass layer, the electronic device further comprising:
   a second glass layer coupled to the first glass layer, wherein the second glass layer is thinner than the first glass layer.

13. The electronic device defined in claim 12 wherein the second glass layer has a surface and wherein at least a portion of the surface is textured.

14. An electronic device having opposing front and rear faces and an interior, the electronic device comprising:
   a display that displays images on the front face; and
   a glass layer that forms a housing wall on the rear face, wherein the glass layer has a laser-damaged region and a region that is free from laser damage.

15. The electronic device defined in claim 14 wherein the laser-damaged region surrounds the region that is free from laser damage.

16. The electronic device defined in claim 14 wherein the region that is free from laser damage surrounds the laser-damaged region.

17. The electronic device defined in claim 14 further comprising a coating that overlaps the region that is free from laser damage, wherein the coating forms a logo.

18. An electronic device having opposing front and rear faces and an interior, the electronic device comprising:
   a display that emits light through the front face;
   a glass layer that forms a housing wall on the rear face, wherein the glass layer has a first region with a shiny appearance and a second region with a matte appearance; and
   a coating on the glass layer that overlaps the first region.

19. The electronic device defined in claim 18 wherein the first region of the glass layer is smooth and wherein the second region of the glass layer is textured.

20. The electronic device defined in claim 19 wherein the coating forms a logo and wherein the coating overlaps only the first region without overlapping the second region.

\* \* \* \* \*